United States Patent
Hatakeyama (10) Patent No.: US 7,094,076 B2
(45) Date of Patent: Aug. 22, 2006

(54) GROUND TERMINAL AND METHOD FOR MOUNTING A GROUND TERMINAL TO A PRINTED BOARD

(75) Inventor: Toshihiro Hatakeyama, Kawagoe (JP)

(73) Assignee: Kyoshin Kogyo Co., Ltd., Tokyo (JP)

( * ) Notice: Subject to any disclaimer, the term of this patent is extended or adjusted under 35 U.S.C. 154(b) by 175 days.

(21) Appl. No.: 10/797,041

(22) Filed: Mar. 11, 2004

(65) Prior Publication Data

US 2004/0209158 A1 Oct. 21, 2004

(30) Foreign Application Priority Data

Apr. 18, 2003 (JP) ............................. 2003-114554

(51) Int. Cl.
*H05K 5/00* (2006.01)
(52) U.S. Cl. .................... 439/97; 439/876; 361/753
(58) Field of Classification Search ............ 439/92, 439/95, 97, 876; 361/753, 799
See application file for complete search history.

(56) References Cited

U.S. PATENT DOCUMENTS

| 3,560,630 A | 2/1971 | Heather |
| 4,851,614 A * | 7/1989 | Duncan, Jr. ............... 174/263 |
| 6,024,586 A * | 2/2000 | Kumagai ................... 439/95 |
| 6,262,887 B1 * | 7/2001 | Lee .......................... 361/683 |
| 6,295,210 B1 * | 9/2001 | Lanzone et al. ........... 361/799 |
| 2001/0012723 A1 | 8/2001 | Tanaka |

FOREIGN PATENT DOCUMENTS

| JP | 4-87275 | 3/1992 |
| JP | 7-161397 | 6/1995 |
| JP | 2863981 B2 | 12/1998 |
| JP | 11-26040 | 1/1999 |

* cited by examiner

*Primary Examiner*—Neil Abrams
(74) *Attorney, Agent, or Firm*—Birch, Stewart, Kolasch & Birch, LLP (57) ABSTRACT

A ground terminal mountable to a peripheral portion of a printed board, which includes a ground terminal body having a pick-up portion picked up by a mounter and a first end edge portion formed with a semicircular notch, and which includes a connection portion formed in, for example, a second end edge portion of the ground terminal body. To mount the ground terminal to a printed board having a first side edge portion formed with a mounting hole having a function of a positioning hole, the printed board is positioned at a part mounting position with its first and second side edge portions individually engaged with first and second guide rails, and the mounter is operated to place the ground terminal on the printed board, with the notch directed to the first guide rail and aligned with the mounting hole.

11 Claims, 7 Drawing Sheets

GROUND TERMINAL AND METHOD FOR MOUNTING A GROUND TERMINAL TO A PRINTED BOARD

CROSS-REFERENCE TO THE RELATED ART

This nonprovisional application claims priority under 35 U.S.C. §119(a) on Patent Application No. 2003-114554 filed in Japan on Apr. 18, 2003, the entire contents of which are hereby incorporated by reference.

BACKGROUND OF THE INVENTION

1. Field of the Invention

The present invention relates to a ground terminal, a printed board mounted with a ground terminal, and a method for mounting a ground terminal to a printed board.

2. Description of the Related Art

Electronic or electrical equipment is comprised of electronic and/or electrical parts (hereinafter referred to as electronic parts) that are mounted to one or more printed boards received in a chassis. In a case where a mounter is used to mount electronic parts on a printed board, the printed board must be positioned at a predetermined part mounting position with respect to the mounter. To this end, a positioning unit for instance is employed that has a positioning pin adapted removably fitted into a positioning hole formed in the printed board. Specifically, the printed board is transported toward the mounter along guide rails of the positioning unit. When the printed board is transported to or near the predetermined part mounting position, the positioning pin is fitted into the positioning hole, whereby the printed board is positioned at the part mounting position.

A further explanation will be given with reference to FIG. 12. Reference numeral 3 denotes one of a pair of guide rails of the positioning unit. A guide groove 3a is formed in an inner side face of the guide rail 3, into which a side edge portion 2a of the printed board 2 is fitted. Reference numeral 2b denotes the positioning hole formed in the printed board 2, into which the positioning pin 4 is removably fitted. The printed board 2 is positioned at the part mounting position by inserting the positioning pin 4 into the positioning hole 2b, and electronic parts are mounted to the printed board 2 by means of the mounter.

As explained above, the printed board 2 is mounted with electronic parts in a condition that both the side edge portions 2a of the printed board 2 are covered by the guide rails 3. Thus, the side edge portions 2a of the printed board 2 constitute a dead space where no electronic parts can be mounted. To widen the part mounting area of the printed board 2, the dead space, i.e., the side edge portions 2a of the printed board 2 are made as narrow as possible. From a similar point of view, the positioning hole 2a is formed near one side edge portion 2a of the printed board 2.

Figure 11:
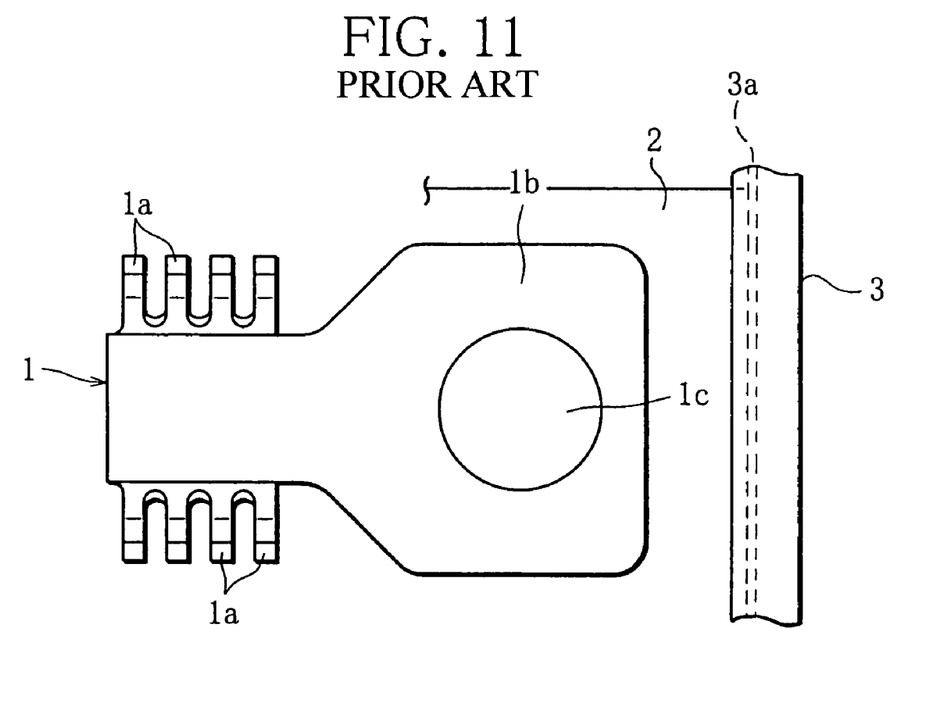
FIG. 11 is a plan view of a conventional ground terminal.

The printed board is mounted with a ground terminal, which is a sort of electronic part, so as to electrically connect the printed board to the chassis through the ground terminal. Such a ground terminal is disclosed in Japanese patent publication no. 2863981, which comprises, as shown in FIG. 11, a plurality of connection portions 1a used for establishing connection between the ground terminal 1 and the printed board, and a fixture portion 1b used for screw-fastening between the ground terminal 1 and the chassis. The fixture portion 1b is formed with a screw insertion hole 1c permitting a screw to extend therethrough.

When the ground terminal 1 shown in FIG. 11 is mounted to the printed board, the ground terminal 1 is placed on the printed board in a condition that the connection portions 1a are aligned with solder portions formed in the printed board and the screw insertion hole 1c is aligned with a screw insertion hole formed in the printed board and with a tapped hole formed in the chassis. Next, the connection portions 1a of the ground terminal 1 are soldered to the solder portions of the printed board. Further, the screw inserted into the screw insertion hole of the ground terminal 1 and that of the printed board is threadedly engaged with the tapped hole of the chassis and is then fastened, to thereby secure both the ground terminal 1 and the printed board to the chassis, whereby the ground terminal 1 is electrically connected through the screw to the chassis, and the printed board is grounded to the chassis through the ground terminal 1.

As mentioned above with reference to FIG. 2, it is preferable that the part mounting area of the printed board 2 be widened. As a measure to increase the part mounting area of the printed board, the screw insertion hole of the printed board may be arranged to have a function of the positioning hole (shown at 2b in FIG. 2) in addition to its primary function of permitting the screw to extending therethrough. In this case, when the ground terminal is mounted to the printed board, the screw insertion hole (shown at 1c in FIG. 11) of the ground terminal must be aligned with the screw-insertion/positioning hole (corresponding to the hole 2b in FIG. 12) of the printed board.

In this regard, the ground terminal 1 shown in FIG. 11 has its fixture portion 1b which is large in size, and therefore, its distal end interferes with the guide rail 3 when an attempt is made to align the screw insertion hole 1c with the positioning hole 2b of the printed board 2. In other words, the ground terminal 1 cannot be mounted to the side edge portion 2a of the printed board 2 around the positioning hole 2 (more generally, to a peripheral portion of the printed board 2). In order to make the ground terminal 1 mountable to the printed board 2, on the other hand, it is essentially required to form the positioning hole 2b at a location away from the side edge portion 2a of the printed board 2, and hence the part mounting area of the printed board 2 decreases accordingly.

SUMMARY OF THE INVENTION

An object of the present invention is to provide a ground terminal mountable in a peripheral portion of a printed board, a printed board mounted with such a ground terminal, and a method for mounting such a ground terminal to a printed board.

According to one aspect of this invention, there is provided a ground terminal which comprises a ground terminal body having a pick-up portion picked up by a mounter and having a first end edge portion formed with a semicircular notch, and a connection portion formed in at least either one of a second end edge portion and first and second side edge portions of the ground terminal body.

The ground terminal of this invention can be mounted, using a mounter, to a printed board, and in particular to a peripheral portion of the printed board that is transported along a pair of guide rails and then positioned at a predetermined part mounting position. Specifically, in a case where the printed board is positioned at the part mounting position in a condition it is partly covered by the guide rails, a mounting hole (for instance, a screw insertion hole) formed in the peripheral portion of the printed board is close to the corresponding guide rail or partly covered by the guide rail. Therefore, if an attempt is made to align the screw insertion hole of the conventional ground terminal shown in FIG. 11 with the mounting hole formed in the peripheral portion of the printed board and having a function of the positioning hole, a distal end of the ground terminal interferes with the guide rail, making it impossible to mount the ground terminal to the printed board. In this respect, according to the ground terminal of this invention, the distal end of the first end edge portion of the ground terminal can be moved to near the mounting hole of the printed board by using a mounter in a condition that the semicircular notch formed in the first end edge portion is directed toward the guide rail, without causing interference with the guide rail. Further, the semicircular notch can be aligned with that corresponding semicircular portion of the mounting hole of the printed board which is on the side remote from the guide rail. In this aligned state, the ground terminal is placed on the printed board, and then the connection portion of the ground terminal is connected to the connection portion of the printed board, whereby the ground terminal can be mounted to the printed board.

The ground terminal of this invention is in particular suitable for use with a printed board having first and second side edge portions thereof fitted to guide grooves formed in inner side faces of first and second guide rails, the printed board being adapted to be transported along the first and second guide rails and positioned at a predetermined part mounting position, having a first side edge portion thereof, on the side close to the first guide rail, formed with a mounting hole having a function of a positioning hole, and having a connection portion on the side remote from the first side edge portion with respect to the mounting hole. In this case, the ground terminal is placed on the printed board in a condition that the semicircular notch is aligned with the mounting hole of the printed board and a gap is defined between that end face of the ground terminal body which is on the side close to the first end edge portion and the inner side face of the first guide rail. Then, the connection portion of the ground terminal is connected to the connection portion of the printed board, whereby the ground terminal is mounted on the printed board.

As mentioned above, the ground terminal of this invention can be mounted even to the printed board whose mounting hole having a function of the positioning hole is formed in a peripheral portion of the printed board with the intention of widening the part mounting area, thus contributing to the increase of the part mounting area of the printed board.

In this invention, the first and second side edge portions of the ground terminal body may extend in a direction away from the second end edge portion beyond the center of a semicircle that defines a semicircular region of the semicircular notch formed in the ground terminal body as viewed in the longitudinal direction of the ground terminal body. This preferred embodiment can increase a contact area between the ground terminal and the printed board, and can prevent or suppress a deformation of the ground terminal which would be caused when the ground terminal and the printed board are fixed to a chassis using a mounting member such as a screw that is inserted into the semicircular notch of the ground terminal and the mounting hole of the printed board.

The second end edge portion of the ground terminal body may be formed with a plurality of connection portions so as to be spaced apart from one another in the width direction of the ground terminal body. Alternatively, a plurality of connection portions may be formed in at least one of the first and second side edge portions of the ground terminal body so as to be spaced from one another in the longitudinal direction of the ground terminal body. Alternatively, one or more connection portions may be formed in each of the second end edge portion and the first and second side edge portions of the ground terminal body. These preferred embodiments can increase the mounting strength between the connection portions of the printed board and the connection portions of the ground terminal body. The first and second end edge portions of the ground terminal body may generally extend in the direction perpendicular to the longitudinal axis of the ground terminal body. Depending on ground terminal mounting conditions in the printed board, at least one of the first and second end edge portions may obliquely extend with respect to the longitudinal axis of the ground terminal body.

A plurality of recesses serving as connection portions may be formed in at least either of the second end edge portion and the first and second side edge portions of the ground terminal body. In this case, the connection portions can be formed in the ground terminal body with ease in low cost.

A distal end portion of the connection portion may be formed into a triangular shape which is convex upward. This reduces stress which would be caused at the connection portions of the printed board and the ground terminal due to a positional dislocation at the time when the printed board mounted with the ground terminal is fixed to the chassis.

According to another aspect of this invention, there is provided a printed board having first and second side edge portions respectively fitted into guide grooves formed in inner side faces of first and second guide rails and adapted to be transported along the first and second guide rails and positioned at a predetermined part mounting position. The printed board is formed at the first side edge portion on the side close to the first guide rail with a mounting hole having a function of a positioning hole, and is formed with a connection portion on a side remote from the first side edge portion with respect to the mounting hole. The printed board is mounted with a ground terminal which comprises a ground terminal body, having a pick-up portion thereof picked up by a mounter and a first end edge portion thereof extending along the first side edge portion of the printed board and formed with a semicircular notch, and a connection portion formed in at least either of a second end edge portion and first and second side edge portions of the ground terminal body. The first and second side edge portions of the ground terminal body extend toward a side remote from the second end edge portion beyond a center of a semicircle that defines a semicircular region of the semicircular notch formed in the ground terminal body in the longitudinal direction of the ground terminal body. The semicircular notch of the ground terminal body is aligned with the mounting hole of the printed board. The ground terminal body has that end face on a side close to the first end edge portion which defines a gap between itself and the inner side face of the first guide rail. The connection portion of the ground terminal is connected to the connection portion of the printed board.

The printed board of this invention is mounted at its peripheral portion with the ground terminal, utilizing the mounting hole having a function of the positioning hole and formed in the first side edge portion of the printed board, and is advantageous in that it has a wide part mounting area.

According to a further aspect of this invention, there is provided a method for mounting a ground terminal to a printed board. The method comprises the steps of: (a) preparing a ground terminal comprising a ground terminal body having a pick-up portion picked up by a mounter and a first end edge portion formed with a semicircular notch, and a connection portion formed in at least either of a second end edge portion and first and second side edge portions; (b)

preparing a printed board having a first side edge portion formed with a mounting hole having a function of a positioning hole and a connection portion formed on a side remote from the first side edge portion with respect to the mounting hole; (c) transporting the printed board along first and second guide rails with the first side edge portion and a second side edge portion respectively engaged with these guide rails and positioning the printed board at a predetermined part mounting position; (d) moving the ground terminal picked up by the mounter in a direction close to the mounting hole of the printed board with the semicircular notch directed to the first guide rail, and placing the ground terminal on the printed board, with the semicircular notch of the ground terminal aligned with a corresponding semicircular region of the mounting hole of the printed board; and (e) connecting the connection portion of the ground terminal to the connection portion of the printed board.

According to the mounting method of this invention, the ground terminal can be mounted by using the mounter to the printed board that is transported along the guide rails and positioned at the part mounting position. In particular, the ground terminal can be mounted even to the printed board formed at its peripheral portion with the mounting hole having a function of the positioning hole.

Preferably, the mounting method of this invention further comprises a step of (f) fixing the ground terminal and the printed board using a screw that is inserted through the semicircular notch of the ground terminal and the mounting hole of the printed board and that is threadedly engaged with a tapped hole of a chassis. According to this preferred embodiment, the printed board mounted with the ground terminal can be securely and accurately mounted to the chassis.

BRIEF DESCRIPTION OF THE DRAWINGS

The present invention will become more fully understood from the detailed description given herein below and the accompanying drawings which are given by way of illustration only, and thus, are not limitative of the present invention, and wherein.

DETAILED DESCRIPTION OF THE PREFERRED EMBODIMENTS

In the following, a ground terminal according to a first embodiment of this invention will be explained with reference to FIGS. 1–4.

As shown in FIGS. 1–4, the ground terminal 7 of this embodiment is adapted to be mounted on a printed board 2 using a mounter, and then fixed to a chassis 8 together with the printed board 2 using a mounting screw 9.

Figure 2:
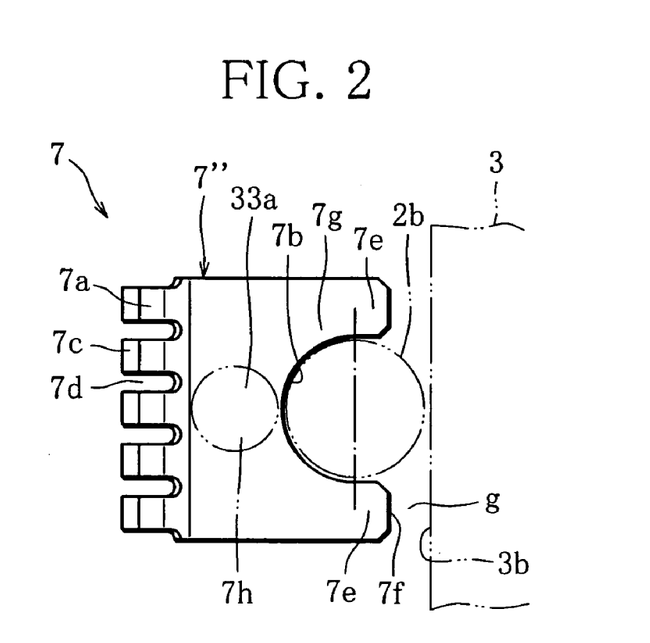
FIG. 2 is a plan view of the ground terminal shown in FIG. 1.
Figure 3:
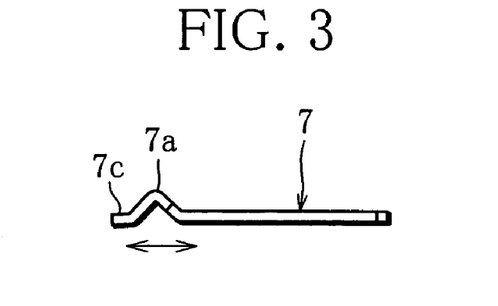
FIG. 3 is an enlarged side view of the ground terminal shown in FIG. 1.
Figure 13:
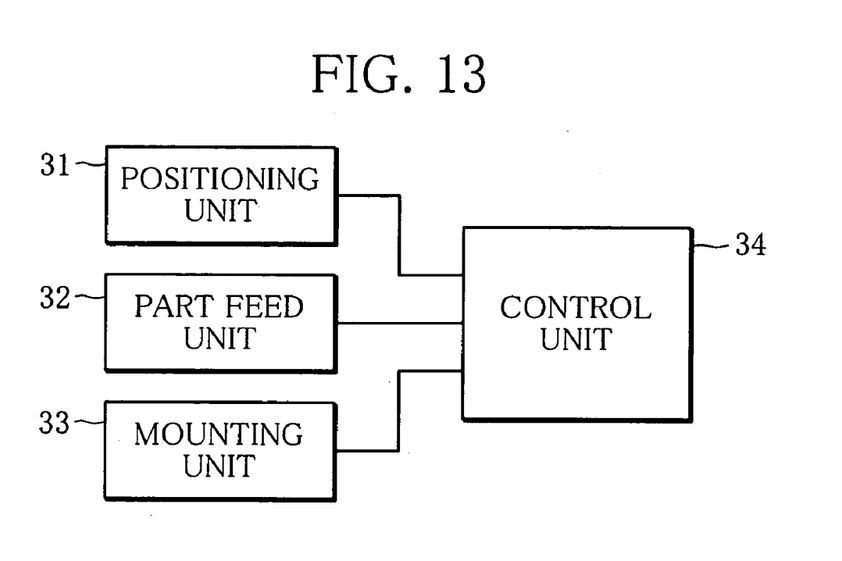
FIG. 13 is a schematic block diagram of a mounter.

The mounter is, as shown by way of example in FIG. 13, comprised of a positioning unit 31 having a drive section, constituted by an air cylinder or the like, for driving a positioning pin, a part feed unit 32 for intermittently feeding a tape to which electrical parts are affixed with a predetermined spacing therebetween, a mounting unit 33 comprising a movable head having a suction pad (shown by a two-dotted chain line and by reference numeral 33a in FIG. 2), and a control unit 34 for drivingly controlling the units 31–33.

Figure 1:
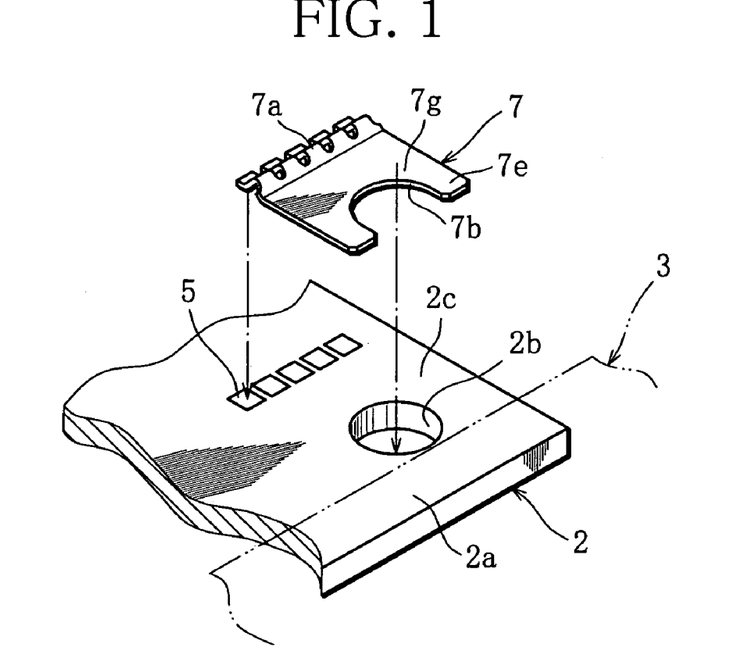
FIG. 1 is a perspective view showing a ground terminal according to a first embodiment of this invention, together with part of a printed board.
Figure 12:
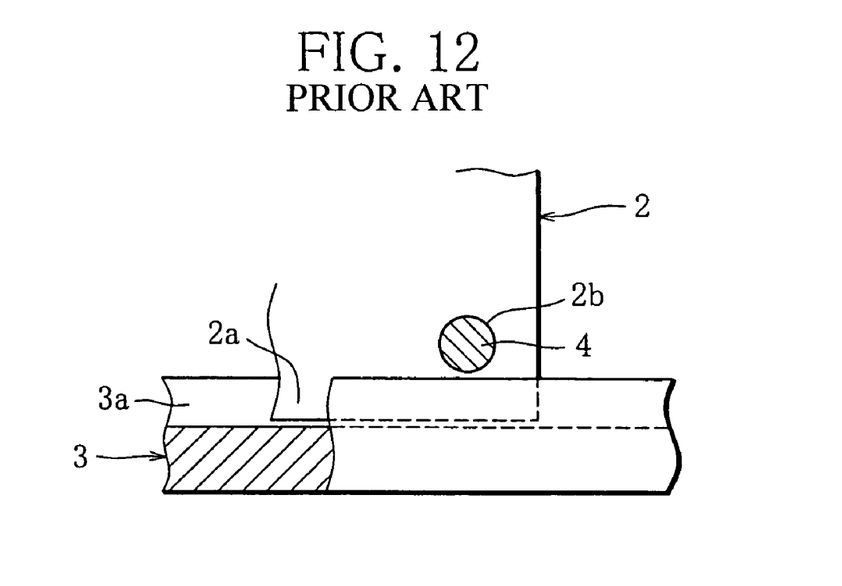
FIG. 12 is a plan view showing a printed board formed with a positioning hole, together with a positioning pin and a guide rail.

On the occasion of mounting electrical parts such as ground terminals 7 to the printed board 2, the printed board 2 is transported to the mounting unit 33 for instance along first and second guide rails (only the first guide rail is shown by reference numeral 3 in FIGS. 1 and 2), with its first and second side edge portions (only the first side edge portion is shown by reference 2a in FIG. 2) fitted into first and second guide grooves (only the first guide groove is shown by reference numeral 3a in FIG. 12) formed in inner side faces of the first and second guide rails of the positioning unit 31, respectively. When the printed board 2 reaches the part mounting position or the vicinity thereof, under the control of the control unit 34, the positioning pin (shown by reference numeral 4 in FIG. 12) of the positioning unit 31 is fitted into a mounting hole 2b of the printed board 2 to thereby position the printed board 2 at the part mounting position. On the other hand, under the control of the control unit 34, the electronic parts such as ground terminals 7 are transported in sequence to the supply position. Then, the electronic part transported to the supply position is picked up by the mounting unit 33 by suction, and is mounted on the printed board 2.

The mounting hole 2b has both a primary function of permitting a mounting screw to extend therethrough and a function of a positioning hole, and will be referred to as positioning hole 2b.

In order to increase the part mounting area of the printed board 2, the positioning hole 2b is formed near the first side edge portion 2a of the printed board. The printed board 2 is formed with connection portions such as solder portions 5 at locations near the positioning hole 2b and on the side remote from the first side edge portion 2a with respect to the positioning hole 2b. The connection portions 7a of the ground terminal 7 are adapted to be soldered to the solder portions 5.

As shown in FIGS. 1 and 2, the ground terminal 7 is formed as a whole into a rectangular as viewed from above, and includes a ground terminal body 7" having at its central region a pick-up portion 7h which is adapted to be picked up by suction by means of a suction pad 33a of the mounter. The ground terminal body 7" is formed at its first end edge portion with a semicircular notch 7b, and formed at its second end edge portion with a plurality of connection portions 7a that are spaced with a spacing 7d in the width direction of the ground terminal body 7". The first and second end edge portions extend in the direction perpendicular to the longitudinal axis of the ground terminal body 7".

Each of the connection portions 7a has a distal end 7c that is soldered to a corresponding solder portion 5 of the printed board 2. A distal end portion of the connection portion 7a is bent into a triangular shape which is convex upward, and is able to be contracted and expanded in the direction shown by an arrow in FIG. 3. Specifically, the distal end portion of the connection portion 7a achieves a function of absorbing a slight positional deviation between the ground terminal 7, the printed board 2, and the chassis when they are fixed into one piece, thereby reducing stress in the solder portion 5 and the connection portions 7a. The connection portions 7a spaced from one another with a spacing 7d increase the solder adherence area when they are soldered to the solder portions 5, whereby the mounting strength of the connection portions 7a to the solder portions 5 is increased, and the connection portions 7a are permitted to be positioned accurately when they are soldered to the solder portions 5.

The ground terminal body 7" has its first and second side edge portions 7e extending from a first end edge to a second end edge. Each side edge portions 7e has a length such that the first end edge of the ground terminal body 7" is located on the side close to the first side edge portion 2a of the printed board 2 with respect to the center of the positioning hole 2b of the printed board 2 as viewed in the longitudinal direction of the ground terminal 7 when the semicircular notch 7b of the ground terminal 7 is aligned with a corresponding semicircular region of the positioning hole 2b of the printed board 2. In other words, the semicircular notch 7b formed in the ground terminal body 7" has a semicircular region having a diameter slightly larger than the diameter of the positioning hole 2b of the printed board 2 and a rectangular region located externally of the semicircular region as viewed in the longitudinal direction of the ground terminal body 7".

In the case of the ground terminal body 7" whose first and second side edge portions 7e have their length as mentioned above, a slight gap g is formed between the first end face 7f of the ground terminal body 7" and the inner side face 3b of the guide rail 3 as shown in FIG. 2 when the ground terminal 7 is positioned such that its semicircular notch 7b is aligned with the positioning hole 2b of the printed board 2. In other words, the ground terminal 7 can be mounted to a peripheral portion of the printed board 2 around the first side edge portion 2a, without causing the distal end of the ground terminal to interfere with the guide rail 3.

From the point of view for avoiding interference between the ground terminal 7 and the guide rail 3 on the occasion of mounting the ground terminal 7 to the printed board 2, it is preferable that the first and second side edge portions 7e of the ground terminal body 7" should have a shorter length. On the other hand, the ground terminal 7 is arranged to be screw fastened to the chassis 8 together with the printed board 2 after the ground terminal 7 is mounted to the printed board 2. Thus, from the viewpoint of preventing a deformation of the ground terminal 7 on the occasion of being screw fastened and of increasing the contact area between the ground terminal 7 and the printed board 2, it is preferable that the first and second side edge portions 7e of the ground terminal body 7" should have a longer length. In this embodiment, to satisfy these conflicting length requirements, the length of the first and second side edge portions 7e of the ground terminal body 7" is set to a value such that a gap g in the order of 1 mm is defined between the first end face 7f of the ground terminal 7 and the inner face 3b of the first guide rail 3 when the semicircular notch 7b of the ground terminal 7 is aligned with the positioning hole 2b of the printed board 2.

In the following, how the ground terminal 7 is mounted to the printed board 2 by using the mounter will be explained.

First, the printed boards 2 and the ground terminals 7 having the aforementioned construction are prepared. The printed boards 2 are sequentially transported along the first and second guide rails 3 of the positioning unit 31 of the mounter, and one of which is positioned at the part mounting portion at a time. On the other hand, the ground terminals 7 affixed to a tape with a constant spacing are loaded to the part feed unit 32 of the mounter, and are sequentially transported to the part feed position.

The ground terminal 7 transported to the part feed position is separated from the tape and picked up by suction at its pick-up portion 7h by means of the suction pad 33a of the movable head of the mounting unit 33, and is moved in the direction close to the mounting hole 2b of the printed board 2, with the semicircular notch 7b directed to the first guide rail 3 and without causing interference with the first guide rail 3. Then, the ground terminal 7 is placed on the printed board 2, with the connection portions 7a of the ground terminal 7 aligned with the solder portions 5 of the printed board 2 and the semicircular notch 7b aligned with the corresponding semicircular region of the mounting hole 2b of the printed board 2. At this time, a semicircular annular portion 7g of the ground terminal body 7" around the notch 7b overlaps at least semicircular region of a circular annular portion 2c of the printed board 2 around the positioning hole 2b. In other words, the semicircular annular portion 7g overlaps a major arc region of the annular portion 2c other than a minor arc region thereof on the side close to the guide rail 3. As shown in FIG. 2, a slight gap g is defined between the first end face 7f of the ground terminal 7 and the inner face 3b of the first guide rail 3.

Next, the connection portions 7a of the ground terminal 7 are soldered and fixed to the solder portions 5 of the printed board 2, whereby the ground terminal 7 is mounted to the peripheral portion of the printed board 2 around the positioning hole 2b.

Figure 4:
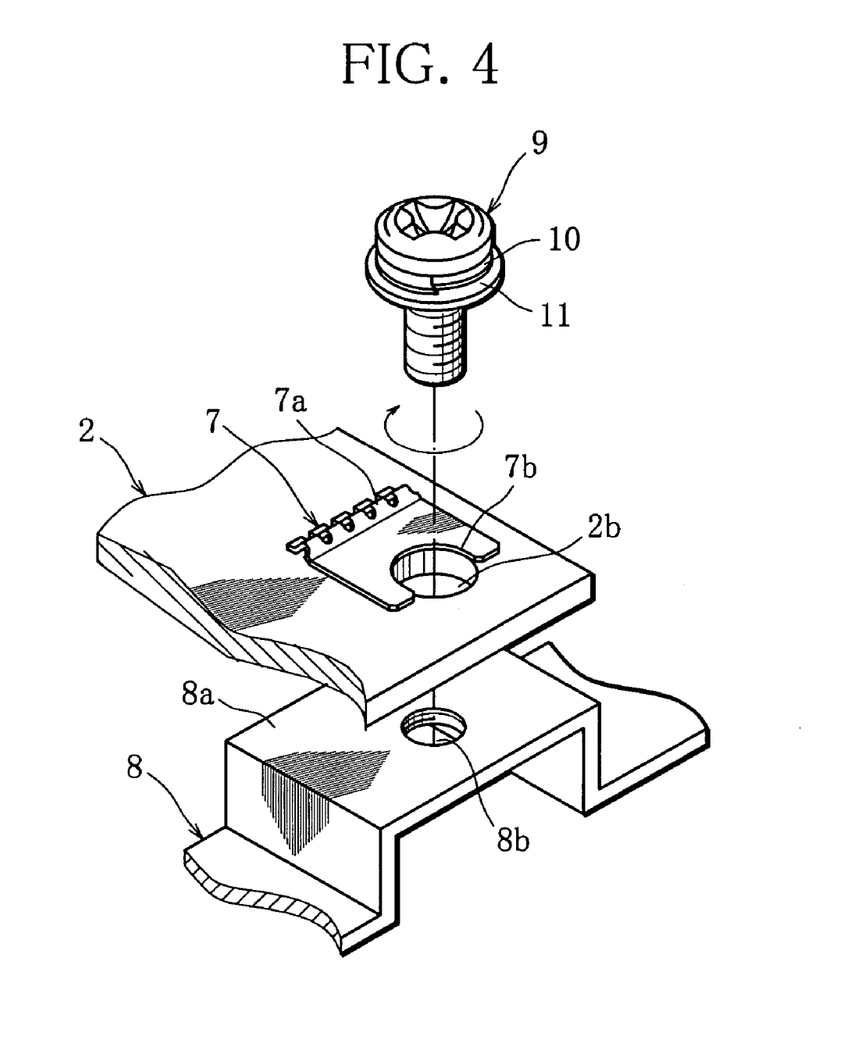
FIG. 4 is a perspective view showing part of the printed board mounted with the ground terminal shown in FIG. 1, together with part of a chassis.

As shown in FIG. 4, the chassis 8 comprises a printed board mounting portion 8a formed with a tapped hole 8b. The printed board 2 mounted with the ground terminal 7 is placed on the mounting portion 8a of the chassis 8, and is fastened to the mounting portion 8a of the chassis 8 together with the ground terminal 7 by means of a mounting screw 9 which extends through the notch 7b of the ground terminal 7 and the positioning hole 2b of the printed board 2 and threadedly engaged with the tapped hole 8b of the chassis 8. The mounting screw 9 may be of a washer built-in type having a spring washer 10 and a plain washer 11. When the printed board 2 mounted with the ground terminal 7 is fastened to the chassis 8 using the screw 9, the upper face of the semicircular annular portion 7g of the ground terminal 7 around the notch 7b is in contact with the lower face of the plain washer 11, and the ground terminal 7 is electrically connected to the chassis 8 through the spring washer 19 and the mounting screw 9, whereby the printed board 2 is grounded to the chassis 8 through the ground terminal 7.

FIGS. 5–10 individually show ground terminals according to second through seventh embodiments of this invention. In each of the embodiments, elements corresponding to those of the ground terminal 7 of the first embodiment shown in FIG. 1 are denoted by corresponding reference numerals and explanations thereof will be omitted.

Figure 5:
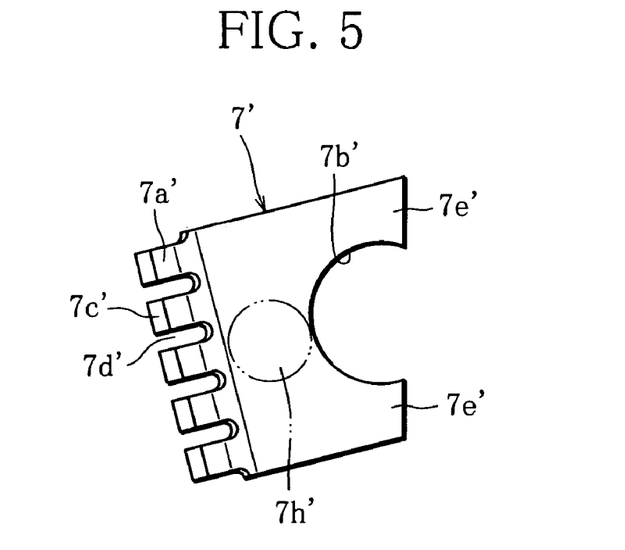
FIG. 5 is a plan view of a ground terminal according to a second embodiment of this invention.

In the ground terminal 7' of the second embodiment shown in FIG. 5, a first end edge portion 7e' of a ground terminal body obliquely extends with respect to the longitudinal axis of the ground terminal body, whereas a second end edge portion extends in the direction perpendicular to the longitudinal axis of the ground terminal body. In FIG. 5, reference numeral 7a' denotes each of a plurality of connection portions formed in the second end edge portion of the ground terminal body so as to be spaced from one another with a spacing 7d' therebetween. Reference numeral 7c' denotes a distal end of each of the connection portions, 7b' denotes a notch formed in the first end edge portion 7e' of the ground terminal body, and 7h' denotes a pick-up portion. The ground terminal 7' is suitable to be mounted to, for example, a printed board 2 in which solder portions 5 obliquely extend with respect to the direction in which the first side edge portion 2a of the printed board 2 extends.

Figure 6:
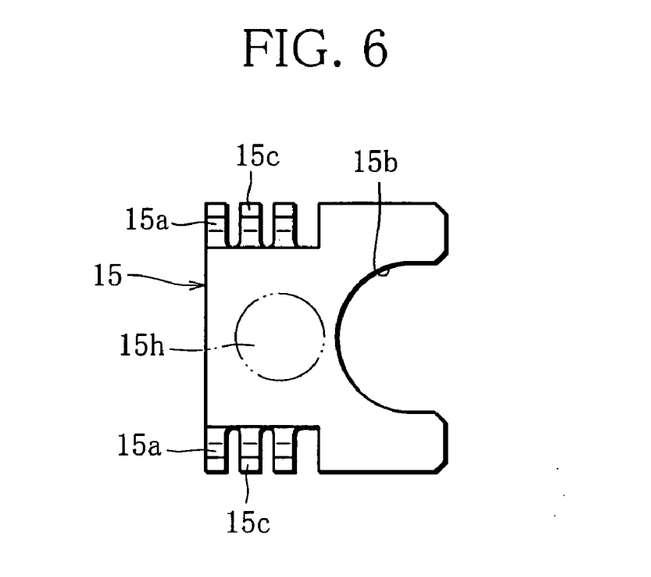
FIG. 6 is a plan view of a ground terminal according to a third embodiment of this invention.

A ground terminal 15 of the third embodiment shown in FIG. 6 includes a ground terminal body whose first half on the side close to a first end edge portion is wide in width and whose second half on the side close to a second end edge portion is narrow in width. Each of the first and second side edge portions of the second half of the ground terminal body is formed with three connection portions 15a. Each of the connection portions 15a extends outward in the direction perpendicular to the longitudinal axis of the ground terminal body. In FIG. 6, reference numeral denotes a notch, 15c denotes a distal end of each connection portion 15a, and 15h denotes a pick-up portion.

Figure 7:
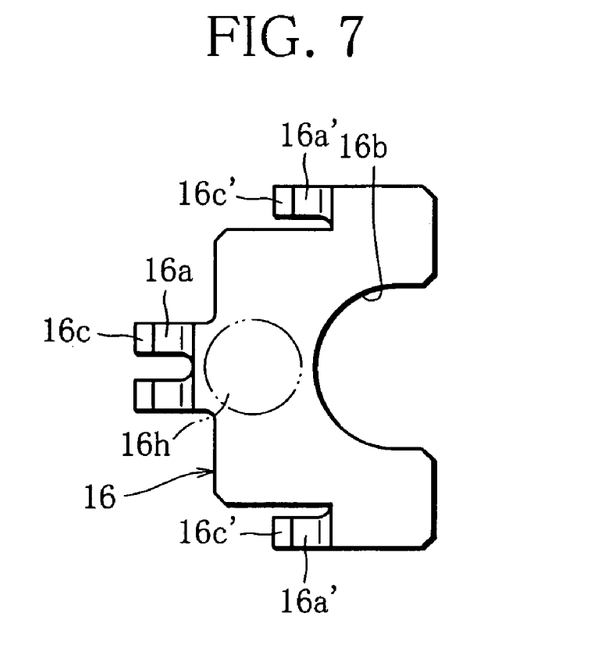
FIG. 7 is a plan view of a ground terminal according to a fourth embodiment of this invention.

A ground terminal 16 of the fourth embodiment shown in FIG. 7 includes a ground terminal body whose first half on the side close to a first end edge portion is wide in width and whose second half on the side close to a second end edge portion is narrow in width. The second end edge portion of the ground terminal body is formed with two connection portions 16a. In each of first and second side edge portions, one connection portion 16a' is formed in an end face of a stepped portion between the first and second halves. Each of the connection portions 16a and 16a' extends in the direction in parallel to the longitudinal axis of the ground terminal body and away from the first end edge portion. In FIG. 7, reference numeral 16b denotes a notch, 16c and 16c' denote distal ends of the connection portions 16a and 16a', and 16h denotes a pick-up portion.

Figure 8:
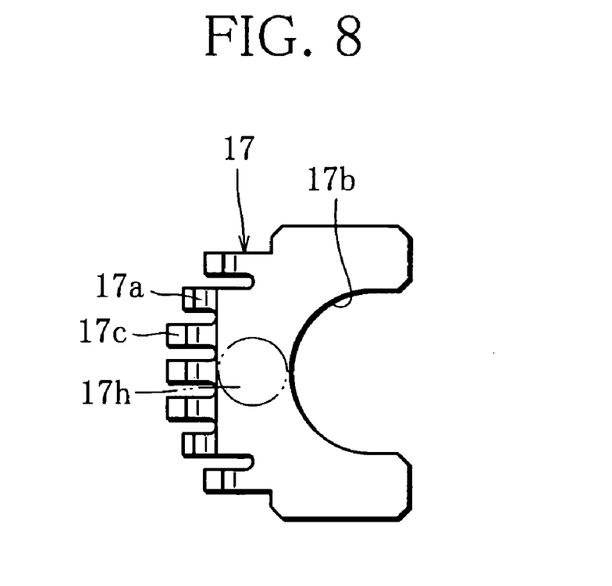
FIG. 8 is a plan view of a ground terminal according to a fifth embodiment of this invention.

In a ground terminal 17 of the fifth embodiment shown in FIG. 8, a ground terminal body comprises an arcuate second end edge portion thereof formed with seven connection portions 17a. Each of the connection portion 17a extends in the direction in parallel to the longitudinal axis of the ground terminal body and away from the first end edge portion. In FIG. 8, reference numeral 17b denotes a notch, 17c denotes a distal end of each connection portion, and 17h denotes a pick-up portion.

Figure 9:
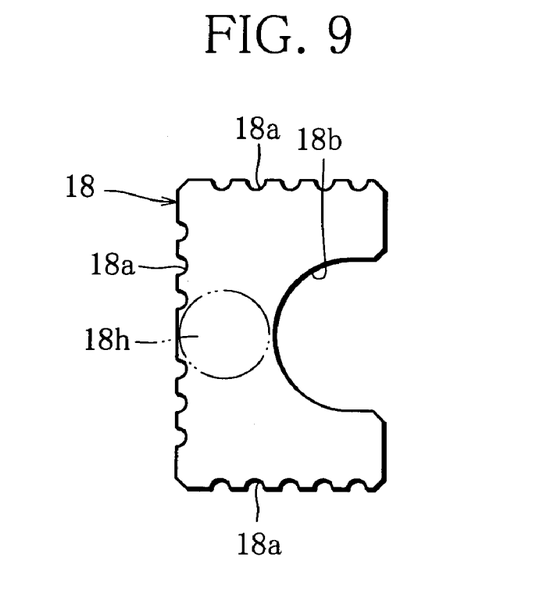
FIG. 9 is a plan view of a ground terminal according to a sixth embodiment of this invention.

In a ground terminal 18 of the sixth embodiment shown in FIG. 9, a semicircular notch 18b is formed in a first end edge portion and a central portion of a ground terminal body. Each of a second end edge portion and first and second side edge portions is formed with a plurality of recesses 18a serving as connection portions. In FIG. 9, reference numeral 18h denotes a pick-up portion. Since the connection portions are constituted by the recesses 18a, the ground terminal 18 can easily be fabricated at low cost.

Figure 10:
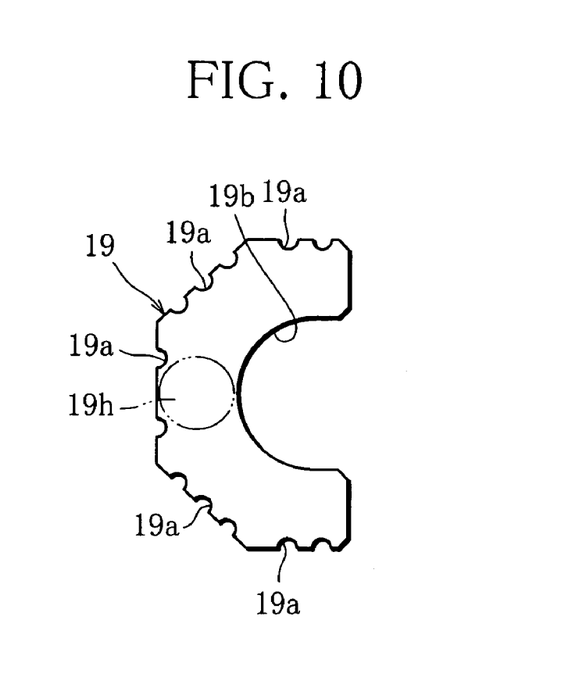
FIG. 10 is a plan view of a ground terminal according to a seventh embodiment of this invention.

In a ground terminal 19 of the seventh embodiment shown in FIG. 10, a semicircular notch 19b is formed in a first end edge portion and a central portion of a ground terminal body. In each of first and second side edge portions and an arcuate second end edge portion, a plurality of recesses 19a serving as connection portions are formed. In FIG. 10, reference numeral 19h denotes a pick-up portion.

This invention is not limited to the first through seventh embodiments, and may be modified variously.

For instance, the entire shape of the ground terminal, locations where the connection portions are formed, and directions in which the connection portions extend may be changed in accordance with ground terminal mounting condition in the printed board.

What is claimed is:

1. A ground terminal comprising:
   a ground terminal body with a generally rectangular shape, the ground terminal body having an axis, first and second end edges extending parallel with each other in a direction perpendicular to the axis, and a pick-up portion provided between the first and second end edges;
   a generally semicircular notch formed in the first end edge of the ground terminal body, the notch having a center displaced from the first end edge toward the second end edge and forming a receiving portion between the first end edge and the pick-up portion of the ground terminal body, the receiving portion extending around the notch adapted to receive a mounting screw; and
   a plurality of grooves formed in the second end edge of the ground terminal body at intervals along the second end edge and extending toward the notch, the grooves forming a plurality of connection portions at the second end edge of the ground terminal body, the connection portions being adapted to be superposed on respective connection portions of a printed board to establish electrical connection.

2. The ground terminal according to claim 1, wherein first and second side edge portions of the ground terminal body extend in a direction away from the second end edge portion beyond a center of a semicircle that defines a semicircular region of the semicircular notch formed in the ground terminal body as viewed in a longitudinal direction of the ground terminal body.

3. The ground terminal according to claim 1, wherein the plurality of connection portions are spaced apart from one another in a width direction of the ground terminal body.

4. The ground terminal according to claim 1, wherein a plurality of connection portions are formed in at least a first side edge portion of the ground terminal body so as to be spaced from one another in a longitudinal direction of the ground terminal body.

5. The ground terminal according to claim 1, wherein the connection portions are also formed at a second side edge portion of the ground terminal body.

6. The ground terminal according to claim 3, wherein the first and second end edge portions of the ground terminal body extend in a direction perpendicular to a longitudinal axis of the ground terminal body.

7. The ground terminal according to claim 3, wherein at least one of the first and second end edge portions obliquely extends with respect to a longitudinal axis of the ground terminal body.

8. The ground terminal according to claim 1, wherein a distal end portion of the connection portions is formed into a triangular shape which is convex upward.

9. A printed board having first and second side edge portions respectively fitted into guide grooves formed in inner side faces of first and second guide rails and adapted to be transported along the first and second guide rails and positioned at a predetermined part mounting position, comprising:

a connection portion formed on a side of the printed board remote from the first side edge portion with respect to a mounting hole that is formed at the first side edge portion on a side close to the first guide rail and that has a function of a positioning hole; and a ground terminal having a ground terminal body with a generally rectangular shape, the ground terminal body having an axis, first and second end edges extending parallel with each other in a direction perpendicular to the axis, and a pick-up portion provided between the first and second end edges;

a generally semicircular notch formed in the first end edge of the ground terminal body, the notch having a center displaced from the first end edge toward the second end edge and forming a receiving portion between the first end edge and the pick-up portion of the ground terminal body, the receiving portion extending around the notch and adapted to receive a mounting screw; and a plurality of grooves formed in the second end edge of the ground terminal body at intervals along the second end edge and extending toward the notch, the grooves forming a plurality of connection portions at the second end edge of the ground terminal body, the connection portions being adapted to be superposed on respective connection portions of a printed board to establish electrical connection, and the connection portion of the ground terminal is connected to the connection portion of the printed board.

10. A method for mounting a ground terminal to a printed board, comprising the steps of:
  (a) preparing a ground terminal comprising a ground terminal body having an axis, first and second end edges extending parallel with each other in a direction perpendicular to the axis, and a pick-up portion provided between the first and second end edges;
  a generally semicircular notch formed in the first end edge of the ground terminal body, the notch having a center displaced from the first end edge toward the second end edge and forming a receiving portion between the first end edge and the pick-up portion of the ground terminal body, the receiving portion extending around the notch and adapted to receive a mounting screw; and
  a plurality of grooves formed in the second end edge of the ground terminal body at intervals along the second end edge and extending toward the notch, the grooves forming a plurality of connection portions at the second end edge of the ground terminal body;
  (b) preparing a printed board having a first side edge portion formed with a mounting hole having a function of a positioning hole and a connection portion formed on a side remote from the first side edge portion of the printed board with respect to the mounting hole;
  (c) transporting the printed board along a first and second guide rail with the first side edge portion and a second side edge portion of the printed board respectively engaged with the first and second guide rails and positioning the printed board at a predetermined part mounting position;
  (d) moving the ground terminal picked up by a mounter in a direction close to the mounting hole of the printed board with the semicircular notch directed to the first guide rail, and placing the ground terminal on the printed board, with the semicircular notch of the ground terminal aligned with a corresponding semicircular region of the mounting hole of the printed board; and
  (e) connecting the connection portion of the ground terminal to the connection portion of the printed board.

11. The mounting method according to claim 10, further comprising a step of:
  fixing the ground terminal and the printed board using a screw that is inserted through the semicircular notch of the ground terminal and the mounting hole of the printed board and that is threadedly engaged with a tapped hole of a chassis.

* * * * *